(12) United States Patent
Wan et al.

(10) Patent No.: US 7,291,557 B2
(45) Date of Patent: Nov. 6, 2007

(54) METHOD FOR FORMING AN INTERCONNECTION STRUCTURE FOR IC METALLIZATION

(75) Inventors: Wen-Kai Wan, Hsin-Chu (TW); Chin-Chiu Hsia, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 114 days.

(21) Appl. No.: 10/940,147

(22) Filed: Sep. 13, 2004

(65) Prior Publication Data
US 2006/0057841 A1  Mar. 16, 2006

(51) Int. Cl.
*H01L 21/44* (2006.01)

(52) U.S. Cl. ............... 438/687; 438/638; 438/643; 438/692

(58) Field of Classification Search .......... None
See application file for complete search history.

(56) References Cited

U.S. PATENT DOCUMENTS

| | | | | |
|---|---|---|---|---|
| 6,100,197 A | * | 8/2000 | Hasegawa | 438/687 |
| 6,136,680 A | * | 10/2000 | Lai et al. | 438/597 |
| 6,376,376 B1 | * | 4/2002 | Lim et al. | 438/687 |
| 6,936,542 B2 | * | 8/2005 | Wojtczak et al. | 438/692 |

* cited by examiner

*Primary Examiner*—Zandra V. Smith
*Assistant Examiner*—Khanh Duong
(74) *Attorney, Agent, or Firm*—Duane Morris LLP

(57) ABSTRACT

A method for forming an interconnection structure in an integrated circuit includes the following steps. A dielectric layer is formed on a semiconductor substrate. An opening is formed on the dielectric layer. A barrier layer is formed over inner walls of the opening and the dielectric layer. A conductive layer is deposited on the barrier layer and filling the opening. Then, a step of planarization is performed to form the interconnection structure, such that a peripheral edge of a top surface of the interconnection structure is no lower than a top surface of the barrier layer.

16 Claims, 5 Drawing Sheets

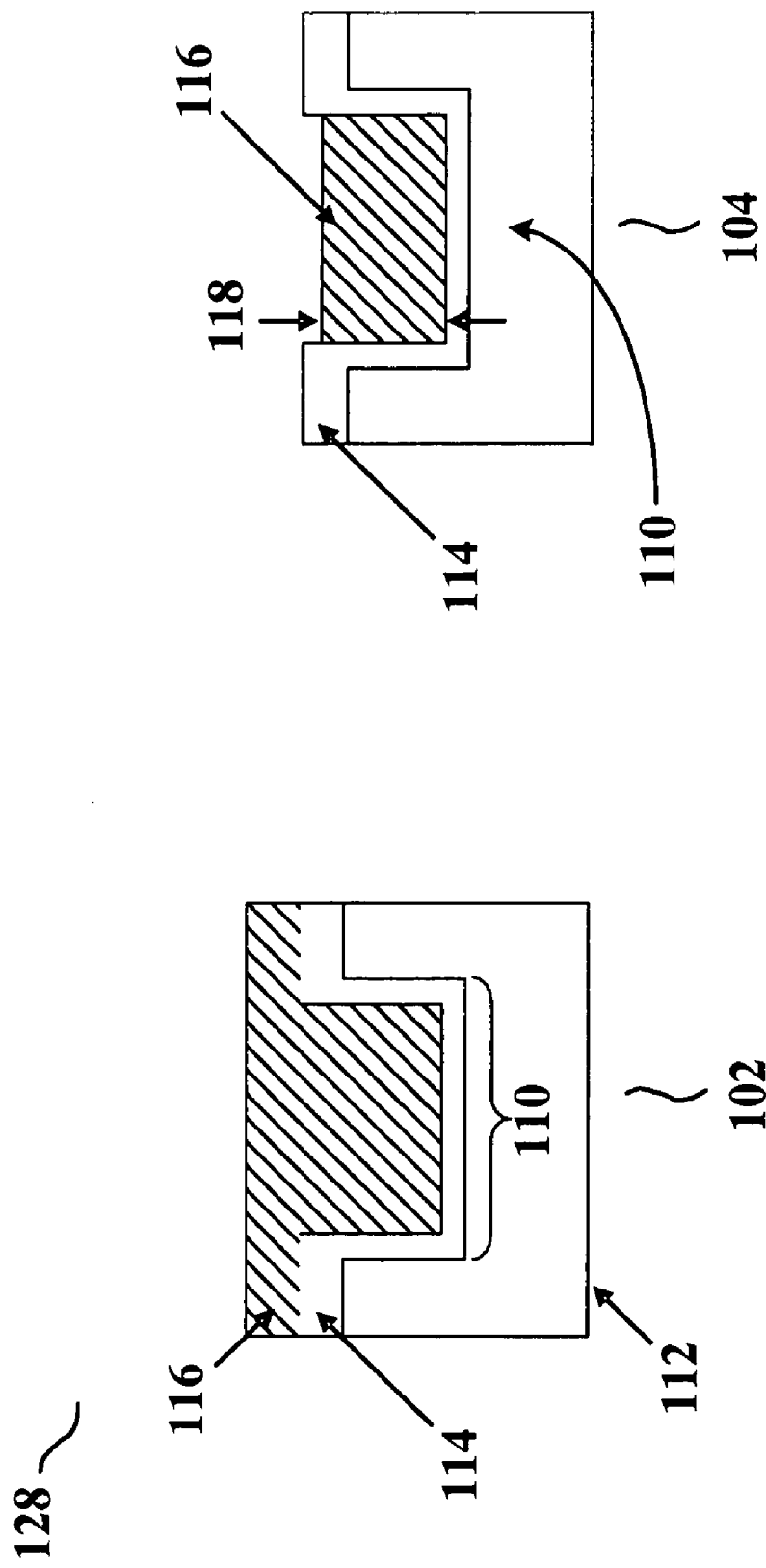

METHOD FOR FORMING AN INTERCONNECTION STRUCTURE FOR IC METALLIZATION

BACKGROUND

The present invention relates generally to a semiconductor device, and more particularly to a convex-shaped interconnection structure for semiconductor devices.

As CMOS transistor scaling proceeds into the deep sub-micron regime, the number of transistors on high performance, high density integrated circuits can increase to tens of millions of transistors. This requires a large number of high density metal interconnection layers. The electrical resistance and parasitic capacitance associated with these metal interconnection layers have become a major limiting factor to circuit speed of high performance integrated circuits. The current trend of decreasing the geometries of semiconductor devices to achieve better electrical performance has placed demands on alternative materials in formation of the metal interconnection layers.

The operational speed of a VLSI (very large scale integration) or ULSI (ultra large scale integration) circuit is determined by the delay time of the interconnection between the internal devices, global wires, and systems. The total delay time is given by the equation: $t_{total} = t_{gate} + RC$ delay. The interconnection delay, defined as the RC delay, (where R is the interconnection resistance, and C is the interconnection capacitance) is one of the most important semiconductor performance factors. The challenge in today's sub-micron semiconductor device design is to reduce the RC delay. In addition, if there is a long distance between internal devices in a large chip operating at a high clock frequency, the LC delay (where L is the line inductance and C is the interconnection capacitance) becomes the dominant factor in the delay time. For long transmission lines in a large chip, using Cu/low k interconnection structures is a popular design choice to minimize the LC transfer loss.

Conventional semiconductor devices have mainly utilized aluminum for VLSI and ULSI device interconnection structures. However, as the semiconductor device geometries have decreased to the sub-micron level, alternatives to the aluminum interconnection structures must be explored to improve device reliability, reduce geometries, and lower fabrication costs. As an example, copper (Cu) based interconnection structures with a low permittivity (low K) dielectric layer are good alternatives to the deficiencies of aluminum interconnection structures. The major interconnection challenges are how to reduce the wiring resistance, capacitance, and number of migration failures. Cu is used in place of Aluminum (Al) because the Cu resistivity is much lower (1.67 u ohm-cm) than the Al resistivity (2.62 u ohm-cm). Also, the higher melting point of Cu (1083.4 degrees C.) versus Al (660 degrees C.) makes it more resistant to migration failures than Al. The EM (electro-migration) of Cu is approximately two orders of magnitude higher than that of Al. As an example of this effect, consider the wiring capacitances of parallel wires 800 nm and 400 nm thick as a function of wiring pitch (width of wires and spaces). The wiring capacitance increases as the wiring pitch is reduced because the capacitance increases as the wires come closer together. The wiring capacitance can be lowered without increasing the sheet resistance by changing the metal from Al to Cu and changing the thickness from 800 nm to 400 nm. This is because the resistivity of a Cu wire is lower than that of an Al wire. Thus, the use of Cu interconnection structures allows for easier high density interconnection design and reduces the number of interconnection levels. The reduction in interconnection layers increases the device reliability and lowers the fabrication costs. An additional method to reduce the interconnection capacitance of a Cu interconnection structure is to utilize low permittivity (low k) dielectric materials.

Copper interconnection structures are typically formed by a "damascene" process including "single damascene" process and "dual damascene" process. In the damascene process, trenches are created in the dielectric layers that form a wiring pattern with Cu deposited in the trenches for each metal layer, while the vias filled with Cu form the plugs between the interconnection layers. Disadvantages to the use of the Cu based interconnection structures are the adverse interaction between the silicon and copper materials. Cu can contaminate the silicon wafer. Therefore, to keep Cu from migrating into the silicon, a barrier layer is applied, and lines the trenches or vias in the silicon-based dielectric layer. A number of materials can be used for the diffusion barrier, such as titanium nitride (TiN), tantalum (Ta), tantalum nitride (TaN), or tantalum (Ta) alloys. Cu is then applied into the trenches or vias by a process, such as ECP (electro-copper deposition), and fills the trench and via. The excess Cu material is then removed by using a chemically active slurry in a chemical mechanical polishing (CMP) process.

The interconnection structure is susceptible to a barrier edge enhanced recess (BEER) problem. Due to the Galvanic effect by a different chemical potential between the interconnection structure and its surrounding barrier layer, the part of the interconnection structure interfacing with the barrier layer would have a higher polishing rate than the rest of the interconnection structure. This causes a recess formed at the interface of the barrier layer and the interconnection structure after the CMP process completes. Conventionally, a capping layer, such as an etch stop layer, would be formed atop the interconnection structure in order for constructing a damascene structure or multiple interconnection layers. Because of the recess, a void would be formed between the capping layer and the interface of the interconnection structure and the diffusion barrier layer. The void is a weak point to electro migration and stress migration, and therefore poses a potential reliability problem.

As such, what is needed is an improved interconnection structure that is free from voids formed at an interface location with its surrounding diffusion barrier layer.

SUMMARY

The invention discloses a structure and method for forming an interconnection structure in an integrated circuit. In one embodiment, a dielectric layer is formed on a semiconductor substrate. An opening is formed on the dielectric layer. A barrier layer is formed over inner walls of the opening and the dielectric layer. A conductive layer is deposited on the barrier layer and filling the opening. Then, a step of planarization is performed to form the interconnection structure, such that a peripheral edge of a top surface of the interconnection structure is no lower than a top surface of the barrier layer.

Although the invention is illustrated and described herein as embodied in a convex shape interconnect structure and associated process to improve semiconductor device copper interconnect reliability, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

FIGS. 2A through 2D illustrate a series of process steps for forming an interconnection structure in an integrated circuit, according to one embodiment of the present invention.

DESCRIPTION

Figures 1A, 1B:
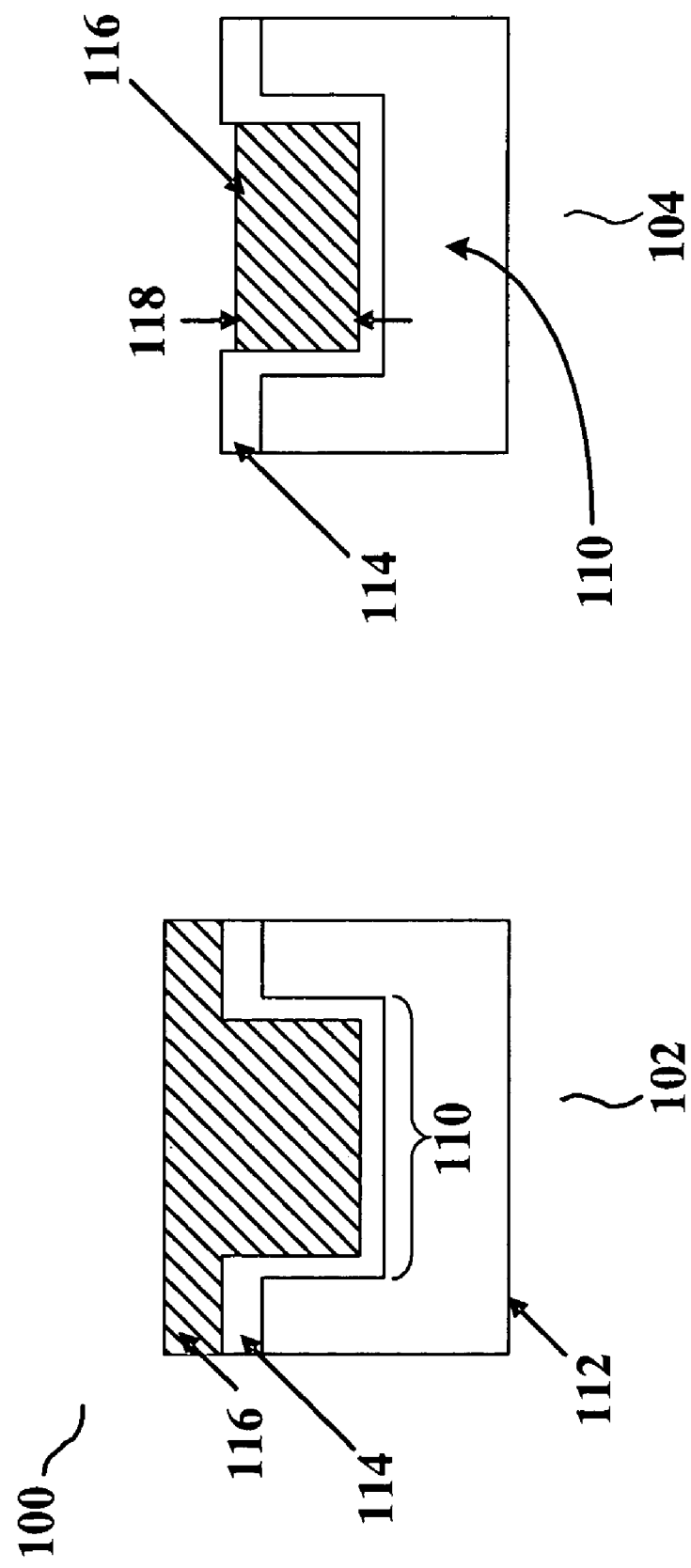
FIGS. 1A through 1D illustrate a conventional process for forming an interconnection structure in an integrated circuit.

FIGS. 1A through 1D present a conventional fabrication process 100 encompassing process steps 102 through 108 for forming an interconnection structure. The first process step 102 starts with an opening 110 formed in the silicon based inter-metal dielectric (IMD) layer 112. The opening is formed when the wafer is coated with a photoresist layer, lithographically patterned, and an anisotropic dry etch cuts down through a portion of the IMD layer 112. The photoresist layer is then stripped, leaving the opening in the IMD layer 112. The opening 110 can be a trench or a via. A trench is created to form a wiring pattern for each metal layer, while a via (holes from one layer to another) forms the plugs between layers. A thin barrier layer 114 is applied as a coating on the inner and bottom walls of the opening 110. A seed layer followed by the deposition of a conductive layer 116 is then applied into and fills the opening 110. Any excess conductive material is then removed by using a chemically active slurry in a CMP process to a point approximately equal to or lower than the surface of the opening 110. The variation of the conductive material level is due to the fact that the conductive layer 116 being removed has a faster polishing rate than the IMD layer 112. As shown in FIG. 1B, the process step 104 shows the height 118 of the conductive layer 166 is low than the top surface of barrier layer 114.

Figure 1C:
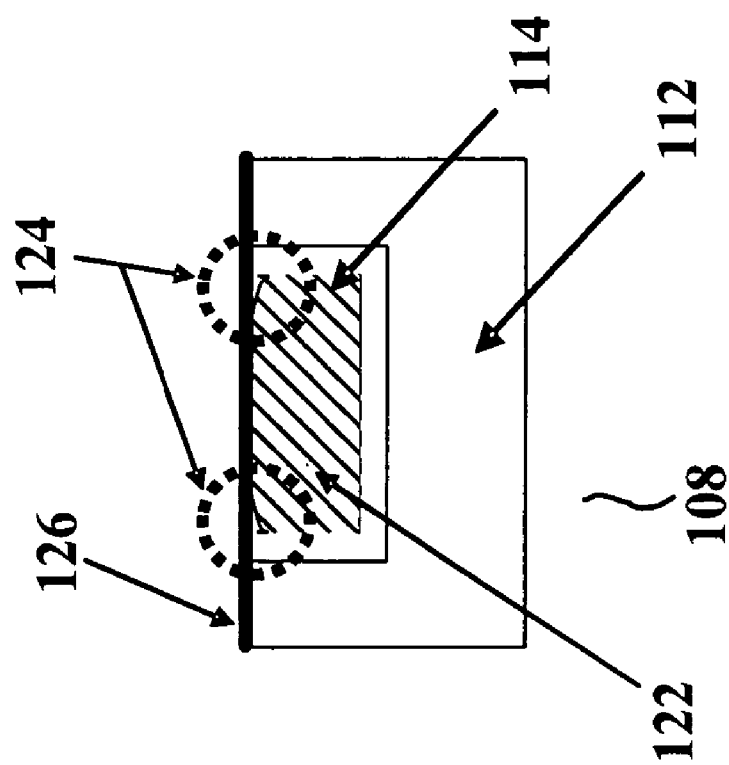

As shown in FIG. 1C, in process step 106, the CMP process continues to partially remove the barrier layer 114 until the top surface of the IMD layer 112 is exposed. The final shape of the top surface of the interconnection structure 122, constituted by the polished conductive layer 116, is dominated by the kind of chemical active slurry used in the CMP process. This creates a chemical potential at the interface of the conductive layer 116 and the barrier layer 114. In this embodiment, the BEER effect creates voids 124 at either side of the opening 110. This BEER effect is due to the Galvanic effect and the much faster polishing rate of the barrier layer 114 than that of the conductive layer 116, which is faster than that of the IMD layer 112.

Figure 1D:
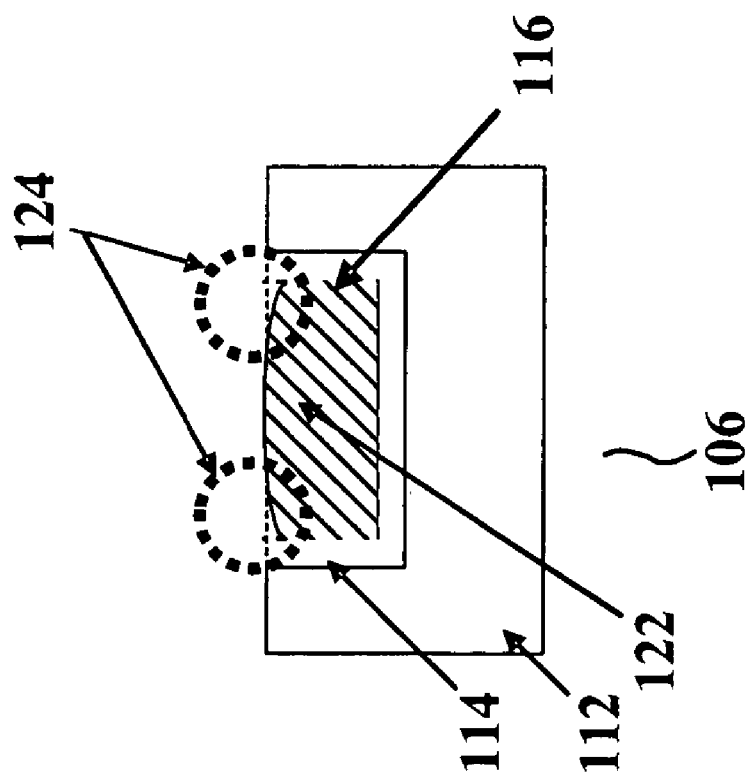

The tiny voids 124 located at the interface between the interconnection structure 122 and the barrier layer 114 may not be filled by an etch stop layer (ESL) 126, which is deposited in the process step 108, as shown in FIG. 1D. These voids 124 become a weak spot in the interconnection structure resulting in reduced integrated circuit electromigration/stress-migration (EM/SM) reliability. EM/SM testing utilizes pre-existing voids at the interface of the interconnection structure and the barrier layer as a preferred void growth site, which provides a fast diffusion path because only a low activation energy is required here.

FIGS. 2A through 2D present the new convex-shaped interconnection structure fabrication process 128, in accordance with one embodiment of the present invention. The procession process 128 encompasses process steps 102, 104, 130, and 132. It is noteworthy that the process steps 102 and 104 are identical to the first two steps in FIGS. 1A and 1B, wherein like numerals denote like structures through out the figures. The process steps 130 and 132 incorporate the new process changes to form the new convex-shaped interconnection structure. These steps will be described below in detail.

Figure 2D:
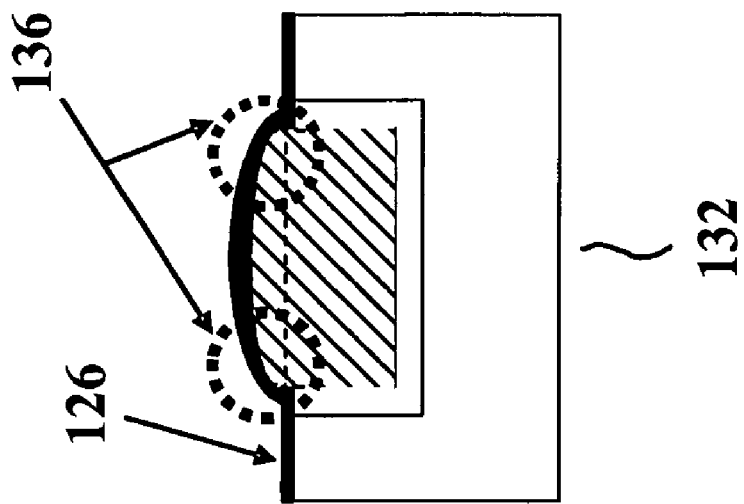
Figure 2C:
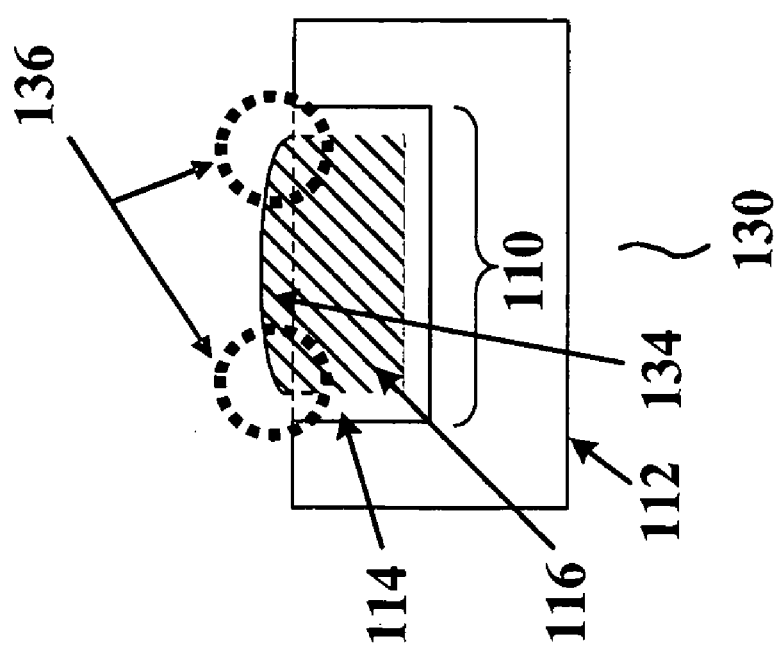

As shown in FIG. 2C, in the process step 130, a barrier layer 114 deposited on a dielectric layer 112 is partially removed in a CMP process to exposed the top surface of the dielectric layer 112. After the CMP process is done, the conductive layer 116 remaining in the opening 110 serves as an interconnection structure 134. The final shape of the interconnection structure 134 is dominated by the polishing rates of the conductive layer 116, the barrier layer 114 and the dielectric layer. It is noteworthy that, in this embodiment, the top of the interconnection structure 134 exhibits a "convex shape" that prevents any creation of voids at an interface locations 136 of the interconnection structure 134 and the barrier layer 114 on either side of the opening 110. This "convex shape" is formed due to a change of the chemical active slurry used for the CMP process. This slurry allows not only for a much faster polish rate for the barrier layer 114 than for the conductive layer 116 and the dielectric layer 112 but also for a reduction of Galvanic effect. In addition, the polishing rate of the dielectric layer 112 is no slower than that of the conductive layer 116. This compensates the chemical potential at the interface of the conductive layer 116 and barrier layer 114. Thus, the completed interconnection structure 134 would have an outer edge no lower than a top edge of the opening 110.

In this embodiment, the opening 110 can be either a trench or a via. The dielectric layer 112 is made of a low-k dielectric based material, which has a dielectric constant lower than 4.0, preferably less than 3.5. The barrier layer 114 is made of a material based on refractory metal, having a melting temperature higher than 1200 C, or its nitrogen-containing compound such as nitrogen-containing tantalum, nitrogen-containing titanium or tantalum. To compromise the chemical potential between the barrier layer 114 and the conductive layer 116, a trace of oxygen may be implanted in the barrier layer 114. The interconnection structure 134 is made of Cu based material. Given a predetermined kind of slurry in a CMP process, the polishing rate of the nitrogen-containing tantalum, nitrogen-containing titanium or tantalum based material is far greater than those of the Cu based material and low-k dielectric material, and the polishing rate of the low-k dielectric material is no smaller than that of the Cu based material.

This adjusted polishing rates help to eliminate the formation of voids at an interface location between the interconnection structure 134 and the barrier layer 114. In addition, the convex-shaped interconnection structure 134 allows for a perfect step coverage in the subsequent step 132 of depositing a capping layer 126, such as an etch stop layer, as shown in FIG. 2D. Typical materials for the capping layer 126 are nitrogen-containing dielectric materials (eg. SiN, SiCN, SiON) or carbon-containing materials (eg. SiC). As such, no voids are formed at the interface locations 136 on either side of the opening 110, and the convex-shaped interconnection structure improves the reliability.

Figure 3:
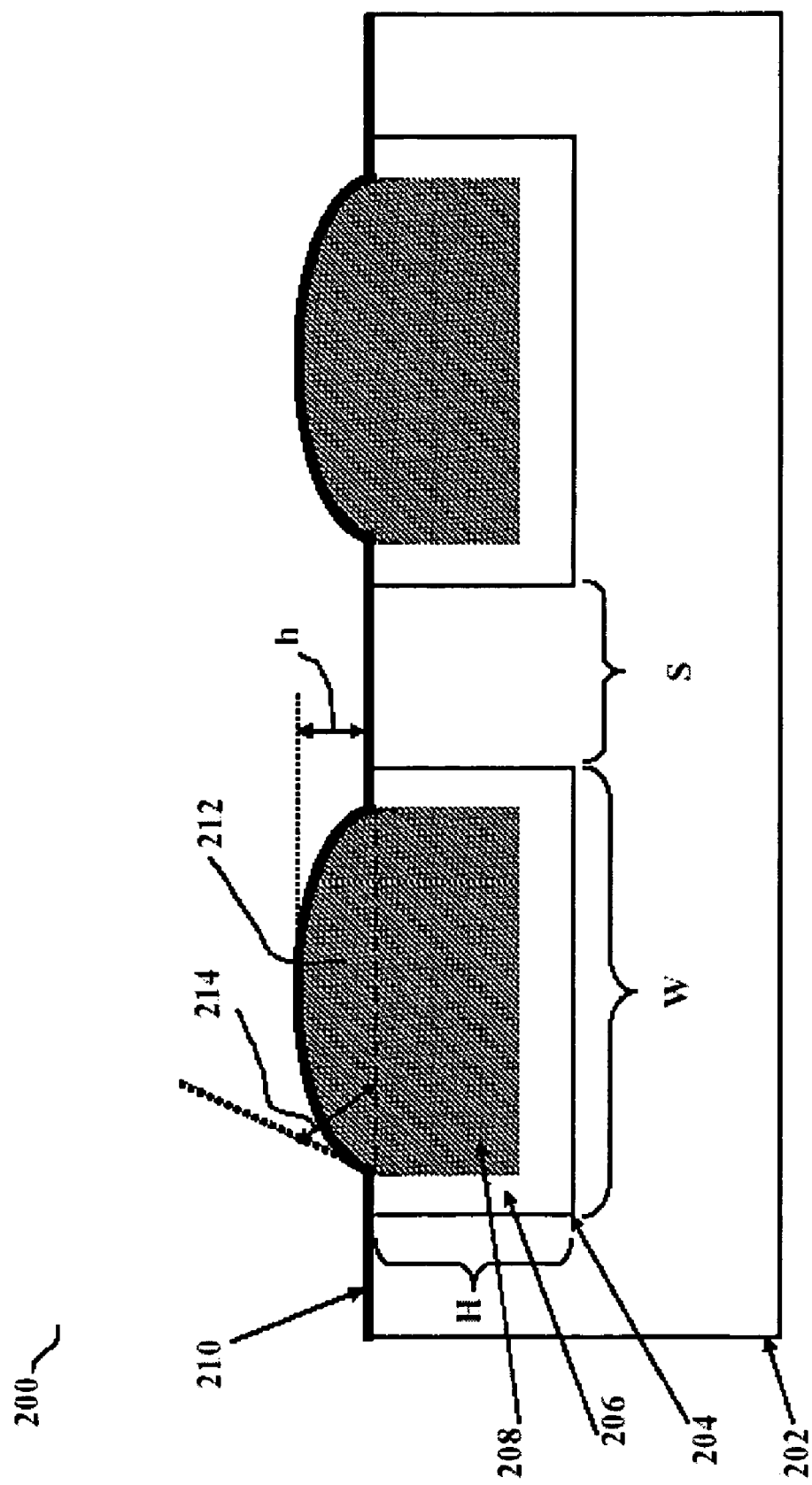
FIG. 3 illustrates a cross-sectional view of an interconnection structure, according to the embodiment of the present invention.

FIG. 3 presents a semiconductor device 200 fabricated by the above method in accordance with one embodiment of the present invention. A low-k dielectric layer 202 with an opening 204 formed therein is deposited on a semiconductor substrate (not shown). The opening 204 is coated with a barrier layer 206 (approximately 150 Angstrom or less on each side) to prevent an interconnection structure 208 from migrating into the dielectric layer 202 and poisoning the same. The part of the interconnection structure 212 extruding from the dielectric layer 202 has dimensional constraints to produce the ideal convex structure such as: given that H is between 0.1 and 1.0 um, W is larger than 0.05 μm, and extrusion height (h) between 100 and 1000 Angstroms, h is larger than 0.01 H; or h is roughly 0.02 H if the opening spacing (S) is smaller than the opening width (W); or h is smaller than 0.1 H if S is larger than W.

In addition, the geometry and the height of the extrusion are also dependent on a pattern density of opening, where the pattern density is defined as following: for a given area comprises a patterned region (the opening region, for example) and a non-patterned region (the non-opening region, for example); the pattern density is the patterned region divided by the given area. The dimensional constraints of the extrusion include an opening pattern density larger than 20%, and an angle 214 between a tangential line at the peripheral edge of its convex-shaped top surface and a horizontal line at the peripheral edge less than 75 degrees. It is understood that this is just one of many examples detailing to optimize performance by managing the convexity and dimensions of the structure.

A capping layer, such as an etch stop layer, 210 composed of SiN, SiCN, SiON, or SiC is deposited on the surface of the interconnection structure 208, thereby allowing subsequent layers to be applied. As such, no void would be formed at an interface location of the interconnection structure 208 and the barrier layer 206.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming an interconnection structure in an integrated circuit, the method comprising:
   forming a dielectric layer with a top surface on a semiconductor substrate,
   forming an opening in the dielectric layer;
   forming a barrier layer over inner walls of the opening including over a bottom wall thereof, and over the dielectric layer
   depositing a conductive layer on the barrier layer and filling the opening; and
   polishing the conductive layer to form the interconnection structure having a convex-shaped top surface, such that a peripheral edge of a top surface of the interconnection structure is no lower than a top surface of the barrier layer,
   wherein a first vertical length measured from the highest point of the convex-shaped top surface of the interconnection structure to the top surface of the dielectric layer is at least one percent of a second vertical length measured from the top surface of the dielectric layer to an interface between the barrier layer and the bottom wall.

2. The method of claim 1 wherein the dielectric layer is made of a low-k material having a dielectric constant lower than 4.0.

3. The method of claim 1 wherein the barrier layer comprises refractory metal having a melting temperature higher than 1200 degrees Celsius.

4. The method of claim 3 wherein the refractory metal comprises tantalum.

5. The method of claim 1 wherein the barrier layer comprises nitrogen-containing tantalum.

6. The method of claim 1 wherein the barrier layer comprises nitrogen-containing titanium.

7. The method of claim 1 wherein the conductive layer is made of a Cu based material.

8. The method of claim 1 wherein the polishing comprises performing a chemical mechanical polishing (CMP) on the conductive layer with a predetermined kind of slurry, whereby the CMP has a higher polishing rate for the dielectric layer than that of the conductive layer.

9. The method of claim 8 wherein the slurry provides the CMP with a higher polishing rate for the barrier layer than those of the dielectric layer and the conductive layer.

10. The method of claim 1 further comprising forming a capping layer over the interconnection structure and the dielectric layer after the polishing, wherein no void is formed between the capping layer and the interconnection structure.

11. The method of claim 10 wherein the capping layer comprises a nitrogen-containing material.

12. The method of claim 11 wherein the nitrogen-containing material is made of silicon nitride based materials.

13. The method of claim 10 wherein the capping layer comprises a carbon-containing material.

14. The method of claim 13 wherein the carbon-containing material is made of silicon carbon based materials.

15. A method for forming an interconnection structure in an integrated circuit, the method comprising:
    forming a dielectric layer with a top surface on a semiconductor substrate;
    forming an opening in the dielectric layer;
    forming a barrier layer over the dielectric layer and over inner walls of the opening including a bottom wall of the opening;
    depositing a conductive layer on the barrier layer end filling the opening; and
    polishing the conductive layer to form the interconnection structure having a convex-shaped top surface, such that a peripheral edge of a top surface of the interconnection structure is no lower than a top surface of the barrier layer,
    wherein a first vertical length measured from the highest point of the convex-shaped top surface of the interconnection structure to the top surface of the dielectric layer is at least two percent of a second vertical length measured from the top surface of the dielectric layer to an interface between the barrier layer and the bottom wall, when a spacing distance between the interconnect structure and a neighboring interconnection structure is no greater than a width of the interconnection structure.

16. A method for forming an interconnection structure in an integrated circuit, the method comprising:
    forming a dielectric layer with a top surface on a semiconductor substrate;
    forming an opening in the dielectric layer;
    forming a barrier layer over the dielectric layer and over inner walls of the opening including a bottom well of the opening;

depositing a conductive layer on the barrier layer end filling the opening; and polishing the conductive layer to form the interconnection structure having a convex-shaped top surface, such that a peripheral edge of a top surface of the interconnection structure is no lower than a top surface of the barrier layer, wherein a first vertical length measured from the highest point of the convex-shaped top surface of the interconnection structure to the top surface of the dielectric layer is at least ten percent of a second vertical length measured from the top surface of the dielectric layer to an interface between the barrier layer and the bottom wall, when a spacing distance between the interconnect structure and a neighboring interconnection structure is no greater than a width of the interconnection structure.

* * * * *

UNITED STATES PATENT AND TRADEMARK OFFICE
CERTIFICATE OF CORRECTION

PATENT NO. : 7,291,557 B2 Page 1 of 1
APPLICATION NO. : 10/940147
DATED : November 6, 2007
INVENTOR(S) : Wen-Kai Wan and Chin-Chiu Hsia It is certified that error appears in the above-identified patent and that said Letters Patent is hereby corrected as shown below:

Column 6, line 44, delete "end" and insert -- and -- therefor.

Column 6, line 66, delete "well" and insert -- wall -- therefor.

Column 7, line 1, delete "end" and insert -- and -- therefor.

Signed and Sealed this

First Day of April, 2008

JON W. DUDAS
*Director of the United States Patent and Trademark Office*